United States Patent [19]
Knierim

[11] Patent Number: 5,418,533
[45] Date of Patent: May 23, 1995

[54] METHOD AND CIRCUIT FOR CONDITIONING A SIGNAL FOR USE IN SYSTEMS HAVING ANALOG-TO-DIGITAL CONVERTER CIRCUITS

[75] Inventor: Daniel G. Knierim, Beaverton, Oreg.

[73] Assignee: Tektronix, Inc., Wilsonville, Oreg.

[21] Appl. No.: 155,401

[22] Filed: Nov. 19, 1993

[51] Int. Cl.$^6$ ............................................. H03M 1/00
[52] U.S. Cl. ..................................... 341/122; 341/118
[58] Field of Search .......................... 341/118, 112–125

[56] References Cited

U.S. PATENT DOCUMENTS

| | | | |
|---|---|---|---|
| 3,699,325 | 10/1972 | Montgomery, Jr. et al. | 341/139 |
| 4,366,469 | 12/1982 | Michaels et al. | 341/139 |
| 4,888,587 | 12/1989 | Kuraishi | 341/122 |
| 5,248,973 | 9/1993 | Babu et al. | 341/156 |

OTHER PUBLICATIONS

"A 4GHz 8b Data Acquisition System", K. Rush and P. Byrne, Hewlett-Parkard Company (1991).

*Primary Examiner*—Marc S. Hoff
*Attorney, Agent, or Firm*—Michael E. Schmitt; Boulden G. Griffith

[57] ABSTRACT

A method and circuit for conditioning a received analog signal for input to an analog-to-digital converter circuit ("ADC"). For each clock period in which a conversion is triggered, a first analog value is provided during a first predetermined period and a second analog value is provided during a second predetermined period. The first analog value is representative of the received analog signal's instantaneous value at the moment selected for conversion. The second analog value is predetermined, typically being a null value. The signal conditioning circuit includes a hold circuit to hold the received analog signal's instantaneous value; a generating circuit that generates the second analog value; and an output circuit that selectively outputs the instantaneous value or the predetermined value to the ADC. The hold circuit, the generating circuit and the output circuits are synchronized with the clock signal clocking the ADC so that the ADC's input signal aperture is contained or centered, or both, substantially within the first predetermined period.

27 Claims, 2 Drawing Sheets

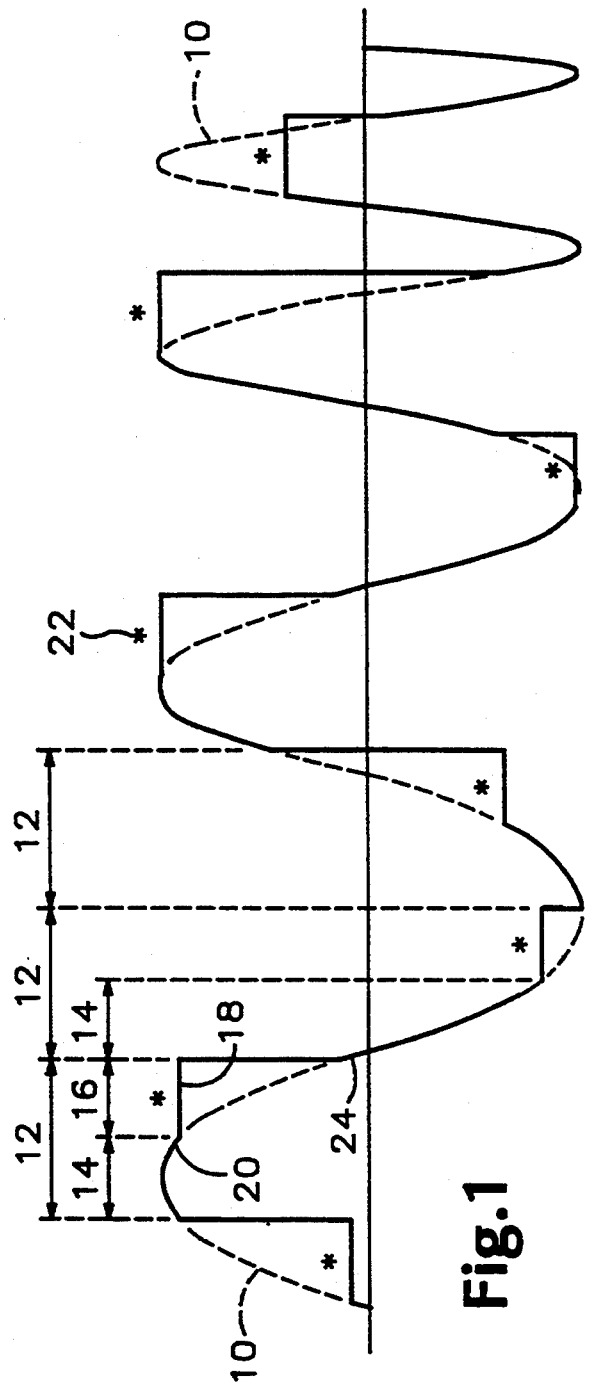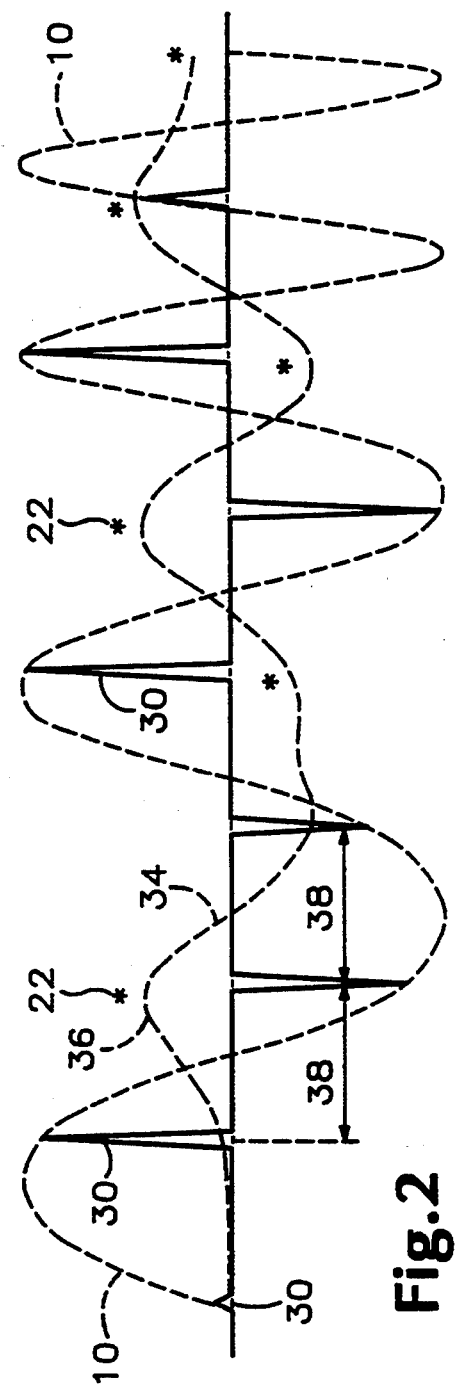

METHOD AND CIRCUIT FOR CONDITIONING A SIGNAL FOR USE IN SYSTEMS HAVING ANALOG-TO-DIGITAL CONVERTER CIRCUITS

BACKGROUND OF THE INVENTION

This invention relates generally to methods and circuits for use in systems having analog-to-digital converter circuits, particularly methods and circuits for conditioning a signal prior to converting it to a digitally coded signal using an analog-to-digital converter circuit.

In electronic systems and instruments, it is often desirable to employ an analog-to-digital converter circuit ("ADC") that converts a received analog signal into a digitally coded signal. For example, oscilloscopes often use an ADC to convert a received analog signal into digital information so that such information can be digitally stored, processed and, ultimately, displayed in an analog form.

An ADC theoretically converts into a digitally coded signal the instantaneous value of a received analog signal at a selected moment. However, in practice ADCs are characterized by input signal apertures such that, rather than converting the received analog signal's instantaneous value, the ADC is sensitive to the received analog signal over a period of time corresponding to and in accordance with the ADC's input signal aperture. Over that period the received analog signal may be changing in value. Because all such values contribute to the conversion, conversion errors are likely to occur. These errors tend to become significant as the received analog signal changes more dynamically during the input signal aperture, thereby creating a nominal conversion bandwidth for the ADC. These errors also tend to become more significant still when the input signal aperture describes a nonlinear function.

As a practical matter, this problem cannot be overcome solely by narrowing the ADC's input signal aperture. The capability to convert higher frequency signals accurately is an ever-existing challenge which, in the absence of any other solution, will require increasingly narrow apertures. While narrowing the aperture may be technologically and financially feasible in some circumstances, in other circumstances that approach is simply not feasible and alternate approaches are sought.

One alternate approach is to isolate the ADC from the received analog signal using a signal conditioning circuit. Signal conditioning circuits typically receive the received analog signal and provide to the converter circuit an analog signal that is representative of the received analog signal and has characteristics conducive to its accurate conversion. In general, signal conditioning circuits are designed to provide an analog signal that has a substantially unchanging value over the corresponding signal input aperture of the ADC, that value being representative of the received analog signal's instantaneous value at the moment selected for conversion. Using signal conditioning in this way, the effective bandwidth of the ADC is optimized without any redesign of the ADC itself. This is a significant advantage because signal conditioning circuits generally can be more readily designed for high bandwidth operation than can ADCs.

However, conventional signal conditioning circuits have significant limitations. One such conventional signal conditioning circuit is a track and hold ("TH") circuit, the operation of which is illustrated in FIG. 1. The TH circuit tracks the received analog signal 10 for a track period 14, which is a portion of a clock period 12, and holds an instantaneous value 18 of the received analog signal 10 for a hold period 16, which is the remaining portion of the clock period 12. The instantaneous value 18 during a given clock period 12 is that value present when the TH circuit transitions from tracking to holding at transition point 20 in that clock period. During the hold period 16, the ADC is clocked to convert the instantaneous value 18, then being held, into a digitally coded signal, the clocking in each clock period 12 being indicated in FIG. 1 by the asterisks 22. This method is repeated during subsequent clock periods 12.

Thence, the TH circuit provides to the ADC, in each clock period 12, a substantially unchanging analog signal (the instantaneous value 18) during a predetermined period of time (the hold period 16). However, outside that hold period 16 the TH circuit provides an analog signal to the ADC that changes with the received analog signal 10. Such changes in value may be substantial, especially at high frequency. To the extent that the ADC's input signal aperture falls outside the hold period 16, the conversion will reflect those changes in value and conversion errors may result. Because conversion errors become significant at higher frequencies, this has a bandwidth limiting effect on the use of the ADC. These errors become more significant still when the ADC's input signal aperture describes a nonlinear function.

To minimize such errors, the ADC generally is clocked in each clock period 12 so as to center its input signal aperture within the hold period 16. Even so, conversion errors arise whenever the input signal aperture is longer than the hold period 16. In that case, at least the aperture's extremities, or "tails," fall outside the hold period 16. Increasing the hold period 16 to capture the aperture's extremities is one approach to this problem. However, it is limited in that it reduces the track period 14, which must be kept sufficiently long to allow the TH circuit to rise to, and settle at, the current value of the received analog signal 10 before transition points 20 when the TH circuit transitions from the tracking period 14 to the subsequent holding period 16.

Another signal conditioning circuit is disclosed which uses sampling and filtering, the operation of which is illustrated in FIG. 2. See Rush and Byrne, "A 4 GHz 8b Data Acquisition System", Proceedings of the 1991 IEEE International Solid-State Circuits Conference, 1991, pp. 176–177. This sample and filter ("SF") circuit takes samples 30 of the received analog signal 10 periodically, and then filters the samples using a passive filter. The samples 30 resemble impulses, as their duration is just long enough to allow rise to the received analog signal's instantaneous value. The passive filter produces an analog signal 34 which dynamically changes in value, having peaks 36 representative of the samples' values. The filter is designed so that peaks 36 are relatively flat. Because the sampling and filtering reduces the amplitude of the received analog signal 10, the analog signal is first amplified and then provided to the ADC for conversion. In the conversion of the analog signal 34, the ADC's input signal aperture is timed to coincide with the signal's peaks 36.

In the absence of the filter, the input to the ADC would be the samples 30, resembling an impulse train.

Between the samples 30, the input would be substantially null. To the extent the ADC's input signal aperture is a linear function, these null inputs will not significantly affect the conversion. Thence, the input signal aperture of the ADC, if centered on a sample 30, could be as long as two sample periods 38. Stated another way, because the sample period 38 of the SF circuit illustrated in FIG. 2 equals the clock period 12 of the TH circuit illustrated in FIG. 1, the SF circuit could use an ADC having an aperture roughly four times greater than the aperture of the TH circuit (somewhat less if the hold period 18 is made greater than half the clock period 12), that is, it could use a much slower ADC.

However, the input signal aperture of an ADC will typically exhibit significant nonlinearities when converting impulses of varying amplitudes, leading to conversion errors. Accordingly, the SF circuit uses the passive filter to shape the analog signal 34, thereby alleviating the nonlinearities. Because the filter itself has an input signal aperture, the ADC must have an aperture no greater than two sample periods 38 less the length of the filter's aperture.

Though the SF circuit has some advantages, it has significant disadvantages. It requires a well-designed filter, which typically cannot be implemented on an integrated circuit with the ADC, and it requires an amplifier to boost the analog signal. Most significantly, it converts an analog signal at a time when that signal is changing. Because its peaks are curved, the analog signal 34 will have a range of values during the input signal aperture, all contributing to the conversion, possibly leading to significant conversion errors due to nonlinearities. If these errors are not addressed, they can be a significant disadvantage. On the other hand, addressing the errors is also a disadvantage in that it requires characterizing the response of the signal conditioning circuit together with the ADC and, with that information, adding a correction capability (such as a look-up table or an interpolation device) to the output of the ADC.

Accordingly, there is a need for an improved method and circuit for conditioning a received analog signal prior to converting it to a digitally coded signal using an ADC.

SUMMARY OF THE INVENTION

The present invention fulfills the aforementioned need by providing a method and circuit for conditioning a received analog signal for input to an ADC such that, during each clock period for which a conversion is triggered, a first analog value is input during a first predetermined period and a second analog value is input during a second predetermined period. The first analog value is representative of the received analog signal's instantaneous value at the moment selected for conversion. The second analog value is predetermined, preferably being a null value. The first and second predetermined periods may or may not be equal; preferably, together they constitute the clock period.

The signal conditioning circuit comprises a hold circuit to hold the instantaneous value of the received analog signal at the moment selected for conversion; a generating circuit that generates the predetermined second analog value; and an output circuit that selectively outputs to the ADC the instantaneous value or the predetermined value. The hold circuit, the generating circuit and the output circuits are synchronized with a clock signal driving the ADC. The hold circuit may be implemented as a conventional track and hold circuit, as described above.

The conversion is timed so that the ADC's input signal aperture is contained or centered, or both, as the case may be, substantially in the first predetermined period. To the extent that the ADC's input signal aperture is contained within the first predetermined period, the digitally coded signal produced by the ADC reflects only the received analog signal's instantaneous value. To the extent that the input signal aperture falls partially outside the first predetermined period, the aperture is substantially contained within the first predetermined period and the contiguous two second predetermined periods. In that case, and to the extent the ADC's input signal aperture is a linear function, the digitally coded signal produced by the ADC reflects the received analog signal's instantaneous value plus contributions from the second analog value (which preferably is null). Even to the extent the ADC's input signal aperture is a non-linear function, the ADC's digitally coded signal will reflect some non-linear (but predetermined) combination of the received analog signal's instantaneous value and the second analog value. In any case, the ADC's digitally coded signal will not be affected by the changes in the received analog signal before or after the moment chosen for conversion.

Accordingly, it is a principal object of the present invention to provide a novel and improved method and circuit for conditioning a received analog signal for input to an ADC.

It is another object to provide such a method and circuit for conditioning a received analog signal for input to an ADC so as to increase conversion accuracy of the ADC, particularly when converting a high frequency signal.

It is a further object to provide such a method and circuit for conditioning a received analog signal for input to an ADC so as to reduce conversion errors, particularly when converting a high frequency signal.

It is yet another object to provide such a method and circuit that provides to an ADC, during the ADC's input signal aperture, a substantially unchanging analog value representative of the received analog signal's instantaneous value at the moment selected for conversion, so as to increase conversion accuracy of that value.

It is yet a further object to provide such a method and circuit that provides to an ADC, during the ADC's input signal aperture, an analog signal comprising a substantially unchanging analog value representative of a received analog signal's instantaneous value at the moment selected for conversion so as to minimize undesirable contributions to the conversion from changes in the received analog signal.

It is another object to provide such a method and circuit that provides to an ADC, during the ADC's input signal aperture, either a substantially unchanging analog value representative of the received analog signal's instantaneous value at a moment selected for conversion, or an analog value predetermined to contribute minimally, if at all, to the conversion.

It is a further object to provide such a method and circuit that provides for increased conversion accuracy when converting a received analog signal having a frequency outside the nominal conversion bandwidth of the ADC being used.

It is yet another object to provide such a method and circuit that can be readily implemented, together with an ADC, in a single integrated circuit.

The foregoing and other objects, features, and advantages of the invention will be more readily understood upon consideration of the following detailed description of the invention, taken in conjunction with the accompanying drawings.

BRIEF DESCRIPTION OF THE DRAWINGS

FIG. 1 shows waveforms received and produced by a conventional signal conditioning circuit, specifically a track and hold circuit, for use with an ADC, and indicates the clocking of the ADC.

FIG. 2 shows waveforms received and produced by a conventional signal conditioning circuit, specifically a sample and filter circuit, for use with an ADC, and indicates the clocking of the ADC.

DETAILED DESCRIPTION OF THE INVENTION

Figure 3:
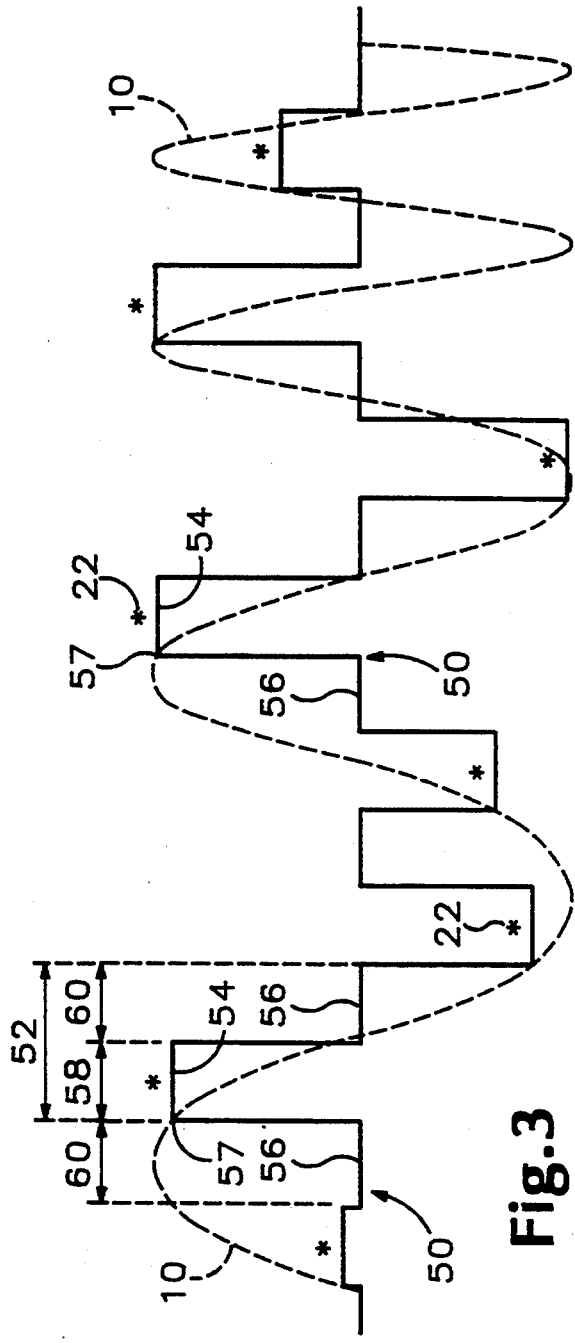
FIG. 3 shows waveforms received and produced by a method and circuit for conditioning a signal for use with an ADC according to the present invention, and indicates the clocking of the ADC.
Figure 5:
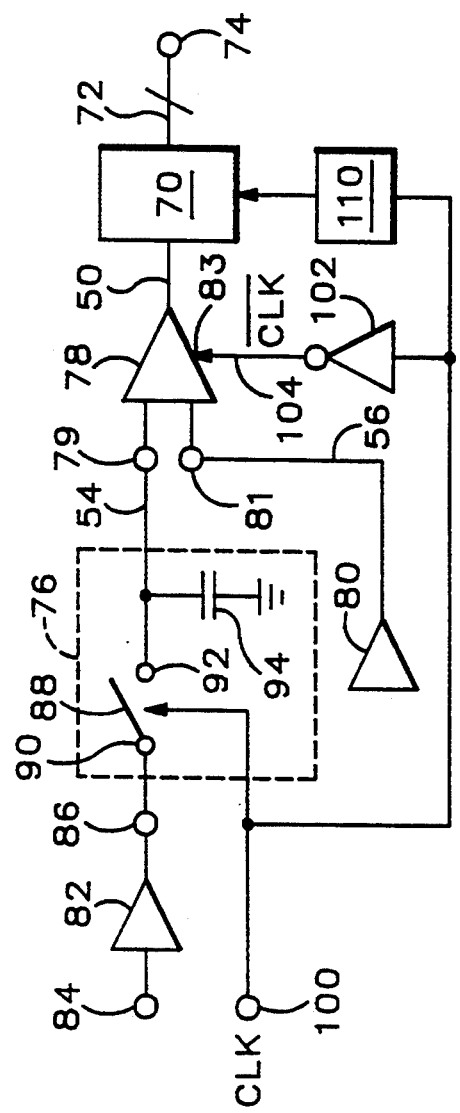
FIG. 5 shows a simplified schematic of a preferred embodiment of a signal conditioning circuit according to the present invention, connected to an ADC.

The operation of the signal conditioning method and circuit of the present invention can be generally understood with reference to FIGS. 3 and 5. The signal conditioning method and circuit receives a received analog signal 10 and, from that signal, an analog signal 50 is produced according to the control of a clock signal 100 having a clock period 52. In each clock period, the analog signal 50 comprises a first analog value 54 and a second analog value 56. The first analog value 54 associated with a given clock period 52 is representative of the received analog signal's instantaneous value in that clock period 52 at selected moment 57. The second analog value 56 is a predetermined value, as is discussed more fully below, which preferably is the same in each successive clock period 52.

The analog signal 50 is at the first analog value 54 for a first predetermined period 58 and is at the second analog value 56 for a second predetermined period 60. During the first and second predetermined periods 58 and 60 in each clock period 52, the respective first and second analog values 54 and 56 are substantially unchanging, that is, their respective peaks are substantially flat. The sum of the first predetermined period 58 and the second predetermined period 60 substantially equals the clock period 52. Although as shown in FIG. 3 the first predetermined period 58 and the second predetermined period 60 may be substantially equal in duration, it is to be recognized that durations of the periods 58 and 60 may be unequal without departing from the principles of the invention.

As shown in FIG. 3 the transitions between the first analog value 54 and the second analog value 56 are substantially instantaneous. However, it is to be recognized that the transitions may be other than substantially instantaneous, that is they may have a finite duration, without departing from the principles of the invention. Preferably, the transitions are substantially shorter in duration than respective periods 58 and 60, the important point being that the transitions are between the first and second analog values 54 and 56 in a relatively short time.

Figure 4:
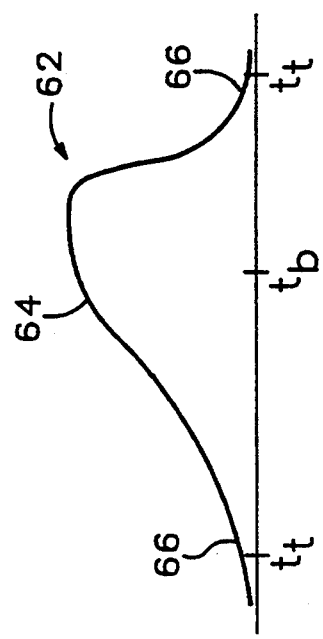
FIG. 4 shows an exemplary input signal aperture for a typical ADC.

Referring now to FIGS. 3, 4 and 5, the analog signal 50, so produced, is provided to an ADC 70. The ADC 70 generally is clocked in each clock period 52 to convert the received analog signal's instantaneous value, as represented by the first analog value 54, into a digitally coded signal 72. The clocking of the ADC is indicated in each clock period 52 by asterisks 22.

The ADC 70 is characterized by an input signal aperture 62 having a duration and a profile. An exemplary form of the input signal aperture 62 is illustrated in FIG. 4, showing its body 64 at time $t_b$, and its tails 66 at times $t_t$. The horizontal axis of FIG. 4 represents time relative to the instant at which the ADC 70 receives a command to convert the analog signal 50 into the digitally coded signal 72. The duration of the aperture 62 is that period of time during which the analog signal 50 has an effect on the ADC's conversion. Ideally, the digitally coded signal 72 represents a linear combination, or weighted average, of the values of analog signal 50 over the aperture's duration, where the profile of the aperture (measured along the vertical axis of FIG. 4) represents the value of the weighting function versus time. In other words, the digitally coded signal 72 represents the integral over time of the analog signal 50 times the aperture weight. In practice, the digitally coded signal 72 may represent a non-linear combination of the analog signal's values over the duration of the aperture. In the non-linear case, the aperture profile is indicative of the relative sensitivity of the ADC's digitally coded signal 72 to the analog signal 50 as a function of time. Thence, the ADC's conversion is sensitive to the analog signal 50 over a period of time corresponding to and in accordance with its input signal aperture 62.

To minimize conversion errors, the ADC preferably is clocked in each clock period 52 so as to contain the input signal aperture 62 substantially within the first predetermined period 58. To the extent that the ADC's input signal aperture is contained within the first predetermined period 58, the digitally coded signal produced by the ADC reflects only the received analog signal's instantaneous value, as represented by the first analog value 54 in each clock period 12.

If the duration of the aperture 62 is greater than the duration of the first predetermined period 58, however, the input signal aperture 62 will extend outside the first predetermined period 58. In that case, to minimize conversion errors, the ADC preferably is clocked in each clock period 52 so as to center the input signal aperture 62 within the first predetermined period 58. In particular, it is preferred to center the input signal aperture so as to contain, for variations of the received analog signal 10 over successive clock periods 52, a maximum amount of the area under the profile of aperture 62 within the first predetermined period 58; for example, by having only the extremities of the tails 66 extending outside the period 58. It is also preferred to center the input signal aperture 62 so as to contain the input signal aperture 62 wholly within the combined length defined by the first predetermined period 58 and the contiguous two second predetermined periods 60; that is, it is preferred to keep the amount of area under the profile of the aperture 62 that encroaches on a previous or subsequent period 58 to zero, or at least to a minimum.

Conversion errors are also minimized by appropriate selection of the second analog value's predetermined value. Preferably, the second analog value 56 is a substantially null value. In that case, when the tails 66 extend outside the first predetermined period 58 into the adjacent second predetermined periods 60, the second analog value 56 will contribute to the conversion by adding zeroes to the weighted average described by the input signal aperture 62, that is, it will lower the ADC's gain. Thence, to the extent that the ADC's input signal aperture 62 describes a linear function, these contributions will not significantly affect the accuracy of conversion. It is important to recognize that, even if the aperture 62 extends into an adjacent second predetermined period 60, each of the ADC's conversions reflects the received analog signal 10 only with respect to the instantaneous value at the respective selected moment 57, and no other value related to the received analog signal 10.

To the extent that the ADC's input signal aperture 62 describes a non-linear function, the contributions from the second analog value 56 may lead to conversion errors. These errors, however, will tend to be small because the aperture 62 is centered so as to contain a maximum amount of the area under the aperture's profile within the first predetermined period 58, leaving only a small amount of the area, i.e., the tails 66, extending into any adjacent second predetermined period 60. If the area under the extending tails 66 is sufficiently small or the ADC 70 has a sufficiently linear input signal aperture 62, or both, the input signal aperture 62 may have a duration up to the combined lengths of the first predetermined period 58 and twice the second predetermined period 60, without introducing significant conversion errors. Thence, the signal conditioning method and circuit can provide increased conversion accuracy when converting a received analog signal having a frequency outside the nominal conversion bandwidth of an ADC.

Referring to FIG. 5, a simplified schematic of a preferred embodiment of a signal conditioning circuit according to the present invention is shown, connected to an ADC 70 producing at an output port 74 a digitally coded signal 72 representative of an analog signal. The ADC preferably is a flash converter or other device that provides for analog-to-digital conversion with a relatively short input signal aperture duration. Although as shown in FIG. 5 the signal conditioning circuit is connected to the ADC 70, it is to be recognized that the signal conditioning circuit may be used with any circuit, such as a clocked analog memory, which samples a received analog signal in accordance with a clock signal, and which can be described in terms of an input signal aperture.

The signal conditioning circuit comprises a hold circuit 76 that holds the first analog value 54. As shown in FIG. 5, the circuit preferably is implemented as a track and hold circuit 76. The track and hold circuit 76 is connected to an output circuit 78 at a first input port 79 of the output circuit 78. A generating circuit 80 that generates the second analog value 56 is connected to the output circuit 78 at a second input port of the output circuit 78. The output circuit 78 is connected to the ADC 70 so as to provide to the ADC 70 the analog signal 50, comprising the first analog value 54 and the second analog value 56.

The signal conditioning circuit preferably comprises a buffer circuit 82, having an input port 84 for receiving the received analog signal 10 and an output port 86 connected to the track and hold circuit 76. The buffer circuit 82 buffers the received analog signal 10 and provides it to the track and hold circuit 76, while preventing changes in the input impedance and current of the track and hold circuit 76 (due to the clocking of the track and hold circuit 76) from disturbing the received analog signal 10 at the input port 84.

The track and hold circuit 76 comprises a switch 88 having an input port 90 connected to the output port 86 of the buffer circuit 82, and an output port 92 connected in parallel to a grounded capacitor 94 at the capacitor's nongrounded side and to the first input port 79 of the output circuit 78. The switch is connected to and controlled by a clock signal 100, labelled CLK. When the clock signal 100 closes the switch 88 at the beginning of second predetermined period 60, the capacitor 94 charges toward and subsequently tracks the received analog signal 10 up to the selected moment 57. When the clock signal 100 opens the switch 88 at the selected moment 57, the capacitor 94 holds and provides the first analog value 54 to the output circuit 78, the first analog value 54 being representative of the received analog signal's instantaneous value at that time.

It is to be recognized that the track and hold circuit 76 can be implemented using a strobed diode bridge, a field effect transistor or a switched transconductance amplifier with feedback in place of switch 88, without departing from the principles of the invention. It is also to be recognized that the track and hold circuit 76 can be implemented using a switched transconductance amplifier connected to, and receiving feedback from, an integrator circuit, as is known in the art, without departing from the principles of the invention. It is also to be recognized that the track and hold circuit 76 can implemented in any of a variety of other ways known in the art, without departing from the principles of the invention.

The output circuit 78, as shown in FIG. 5, preferably is a high speed amplifier having low input current. The output circuit 78 has a control input 83 that is connected to an inverter 102 that has as its input the clock signal 100. The output circuit 78 provides the analog signal 50 under the control of signal 104, which is the inverse of the clock signal 100. When the clock signal 100 closes the switch 88 of the track and hold circuit 76, the inverted clock signal 104 causes the output circuit 78 to provide to the ADC 70 the second analog value 56 generated by the generating circuit 80. When the clock signal 100 opens the switch 88, the inverted clock signal 104 causes the output circuit 78 to provide to the ADC 70 the first analog value 54 being held by the capacitor 94 of the track and hold circuit 76.

It is to be recognized that, although shown separately in FIG. 5 for the sake of clarity, the output and generating circuits 78 and 80 can and preferably would comprise one amplifier circuit having two selectable gains, one gain associated with the first analog value 54 and the other gain associated with the second analog value 56. In such an amplifier, a second analog value 56 that has a substantially null value is generated by setting the gain associated therewith to zero. A zero gain generally is produced either by switching off a stage of the amplifier in the signal path, or by inverting the gain of one of two parallel signal paths, the outputs of which are subsequently summed. Thence, the inverted clock signal 104, when applied to the output circuit 78 implemented as a switchable gain amplifier, provides the analog signal 50 by selecting between the amplifier's two selectable gains. Amplifiers that have selectable gains, particularly those that can provide a selectable zero gain, can be implemented in a variety of ways known in the art.

The signal conditioning circuit also shows a synchronization circuit 110 connected at its output to the ADC 70 and having as its clock input the clock signal 100. The synchronization circuit 110 clocks the ADC 70 so that the ADC converts the analog signal 50 at the clocking times indicated by the asterisks 22 in FIG. 3. It is to be recognized that, depending on the design of the system, particularly the design of the ADC, the synchronization circuit 110 may or may not be preferred. What is important is that, in each clock period 52, the track and hold circuit 76 and the ADC 70 are synchronized so that the ADC's input signal aperture is contained or centered, or both, as the case may be, substantially in the first predetermined period 58 as described above.

It is to be recognized that the signal conditioning circuit can be implemented using differential techniques without departing from the principles of the invention.

The digitally coded signal 72 output by the ADC is in a form that can readily be used in a variety of applications, such as in instruments, including oscilloscopes, where the signal can be stored and processed digitally and reconstructed for display. The signal 72 can also be routed to a computer bus for other uses in digital systems. In addition, because of the simplicity of the circuit, it can be readily implemented on a single integrated circuit together with its associated ADC. Such implementation minimizes problems degrading performance, such as skin loss of traces of hybrid circuits or printed-circuit boards, that otherwise can be introduced when connecting separately realized circuits operating at high frequency.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. An analog-to-digital conversion system, comprising:
   an analog-to-digital converter circuit for producing a digitally coded signal representative of an analog input signal; and
   a signal conditioning circuit responsive to a received analog signal, including
      holding means for holding a first analog value over a first predetermined period, said first analog value being representative of the amplitude of said received analog signal at a predetermined time;
      generating means for generating a second analog value over a second predetermined period, said second analog value being a predetermined value; and
      output means for providing said analog input signal to said analog-to-digital converter circuit, said analog signal being, during said first predetermined period, said first analog value and, during said second predetermined period, said second analog value.

2. The system of claim 1, wherein said second analog value is substantially null.

3. The system of claim 1, wherein said analog-to-digital converter circuit is characterized by an input signal aperture and is clocked by a clock signal, and said holding means is synchronized with said clock signal so that said input signal aperture is contained substantially within said first predetermined period, whereby conversion error is minimized.

4. The system of claim 1, wherein said analog-to-digital converter circuit is characterized by an input signal aperture and is clocked by a clock signal, and said holding means is synchronized with said clock signal so that said input signal aperture is centered substantially within said first predetermined period, whereby conversion error is minimized.

5. The system of claim 1, wherein said analog-to-digital converter circuit is characterized by an input signal aperture and is clocked by a clock signal, said first predetermined period is interposed between a pair of said second predetermined periods, and said holding means and generating means are synchronized with said clock signal so that said input signal aperture is contained wholly within the period defined by said first predetermined period and said pair of said second predetermined periods.

6. The system of claim 1, wherein said holding means comprises tracking means for tracking said received analog signal up to said predetermined time.

7. The system of claim 6, wherein said holding means comprises a switch having an output port connected in parallel to a grounded capacitor at said capacitor's non-grounded side and to said output means, said switch being controlled by a clock signal.

8. The system of claim 7, wherein said switch comprises a strobed diode bridge.

9. The system of claim 7, wherein said generating means and said output means comprise an amplifier circuit having two selectable gains, one of said two selectable gains being substantially zero, and said clock signal is applied to said amplifier circuit to select between said two selectable gains.

10. A signal conditioning circuit having an input port for receiving a received analog signal, comprising:
    holding means for holding a first analog value over a first predetermined period, said first analog value being representative of said received analog signal at a predetermined time;
    generating means for generating a second analog value over a second predetermined period, said second analog value being a predetermined value; and
    output means for providing as an output from said signal conditioning circuit an analog signal, said analog signal being, during said first predetermined period, said first analog value and, during said second predetermined period, said second analog value.

11. The signal conditioning circuit of claim 10, wherein said second analog value is substantially null.

12. The signal conditioning circuit of claim 10, wherein said holding means is synchronized with a clock signal that clocks an analog-to-digital converter circuit for receiving said output and having an input signal aperture so that said input signal aperture is contained substantially within said first predetermined period, whereby analog-to-digital conversion error is minimized.

13. The signal conditioning circuit of claim 10, wherein said holding means is synchronized with a clock signal that clocks an analog-to-digital converter circuit for receiving said output and having an input signal aperture so that the input signal aperture is centered substantially within said first predetermined period, whereby analog-to-digital conversion error is minimized.

14. The signal conditioning circuit of claim 10, wherein said output is provided to an analog-to-digital converter circuit clocked by a clock signal and having an input signal aperture, said first predetermined period is interposed between a pair of said second predetermined periods, and said holding means and generating means are synchronized with said clock signal so that said input signal aperture is contained wholly within the period defined by said first predetermined period and said pair of said second predetermined periods.

15. The signal conditioning circuit of claim 10, wherein said holding means comprises tracking means for tracking the received analog signal up to said predetermined time.

16. A method for producing a digitally coded signal representative of a received analog signal, comprising the steps of:

holding a first analog value over a first predetermined period, said first analog value being representative of said received analog signal at a predetermined time;

generating a second analog value over a second predetermined period, said second analog value being a predetermined value;

providing an analog signal for conversion into the digitally coded signal, said analog signal being, during said first predetermined period, said first analog value and, during said second predetermined period, said second analog value; and converting said analog signal into the digitally coded signal.

17. The method of claim 16, wherein said second analog value is substantially null.

18. The method of claim 16, wherein said analog signal is converted into the digitally coded signal in said converting step using an analog-to-digital converter circuit characterized by an input signal aperture, and said analog-to-digital conversion is clocked so that said input signal aperture is contained substantially within said first predetermined period, whereby analog-to-digital conversion error is minimized.

19. The method of claim 16, wherein said analog signal is converted into the digitally coded signal in said converting step using an analog-to-digital converter circuit characterized by an input signal aperture, and said analog-to-digital conversion is clocked so that said input signal aperture is centered substantially within said first predetermined period, whereby analog-to-digital conversion error is minimized.

20. The method of claim 16, wherein said analog signal is converted into the digitally coded signal in said converting step using an analog-to-digital converter circuit clocked by a clock signal and characterized by an input signal aperture, said first predetermined period is interposed between a pair of said second predetermined periods, and said holding step and generating step are clocked by said clock signal so that said input signal aperture is contained wholly within the period defined by said first predetermined period and said pair of said second predetermined periods.

21. The method of claim 16, further comprising successively repeating said holding, generating, providing and converting steps.

22. A method for conditioning a received analog signal, for use with an analog-to-digital converter circuit having an input signal aperture and producing a digitally coded signal when clocked by a clock signal having a predetermined clock frequency, comprising the steps of:

holding a first analog value over a first predetermined period, said first analog value being representative of the received analog signal at a predetermined time;

generating a second analog value over a second predetermined period, said second analog value being a predetermined value; and providing an analog signal to said analog-to-digital converter circuit, said analog signal being, during said first predetermined period, said first analog value and, during said second predetermined period, said second analog value.

23. The method of claim 22, wherein said second analog value is substantially null.

24. The method of claim 22, wherein said analog-to-digital converter circuit is clocked by the clock signal so that the input signal aperture is contained substantially within said first predetermined period, whereby analog-to-digital conversion error is minimized.

25. The method of claim 22, wherein said analog-to-digital converter circuit is clocked by the clock signal so that the input signal aperture is centered substantially within said first predetermined period, whereby analog-to-digital conversion error is minimized.

26. The method of claim 22, wherein said first predetermined period is interposed between a pair of said second predetermined periods, and said holding step and generating step are clocked by said clock signal so that said input signal aperture is contained wholly within the period defined by said first predetermined period and said pair of said second predetermined periods.

27. The method of claim 22, further comprising successively repeating said holding, generating and providing steps.

* * * * *